(12) United States Patent
Wang et al.

(10) Patent No.: US 10,985,061 B2
(45) Date of Patent: *Apr. 20, 2021

(54) METHODS FOR FORMING CONTACT PLUGS WITH REDUCED CORROSION

(71) Applicant: Taiwan Semiconductor Manufacturing Company, Ltd., Hsinchu (TW)

(72) Inventors: Yu-Sheng Wang, Tainan (TW); Chi-Cheng Hung, Tainan (TW); Chen-Yuan Kao, Zhudong Township (TW); Yi-Wei Chiu, Kaohsiung (TW); Liang-Yueh Ou Yang, New Taipei (TW); Yueh-Ching Pai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/678,410

(22) Filed: Nov. 8, 2019

(65) Prior Publication Data

US 2020/0075407 A1 Mar. 5, 2020

Related U.S. Application Data

(63) Continuation of application No. 16/213,326, filed on Dec. 7, 2018, now Pat. No. 10,483,165, which is a (Continued)

(51) Int. Cl.
*H01L 29/417* (2006.01)
*H01L 29/78* (2006.01)
(Continued)

(52) U.S. Cl.
CPC .... *H01L 21/76895* (2013.01); *H01L 21/2885* (2013.01); *H01L 21/7684* (2013.01);
(Continued)

(58) Field of Classification Search
CPC .......... H01L 29/4238; H01L 29/42372; H01L 29/4175; H01L 29/41725; H01L 29/41775;
(Continued)

(56) References Cited

U.S. PATENT DOCUMENTS 5,998,873 A 12/1999 Blair et al.
7,189,650 B2 3/2007 Liu et al.
(Continued)

FOREIGN PATENT DOCUMENTS

CN 1790663 A 6/2006
CN 103579175 A 2/2014
(Continued)

*Primary Examiner* — Michael M Trinh
(74) *Attorney, Agent, or Firm* — Slater Matsil, LLP

(57) ABSTRACT

A method includes forming an ILD to cover a gate stack of a transistor. The ILD and the gate stack are parts of a wafer. The ILD is etched to form a contact opening, and a source/drain region of the transistor or a gate electrode in the gate stack is exposed through the contact opening. A conductive capping layer is formed to extend into the contact opening. A metal-containing material is plated on the conductive capping layer in a plating solution using electrochemical plating. The metal-containing material has a portion filling the contact opening. The plating solution has a sulfur content lower than about 100 ppm. A planarization is performed on the wafer to remove excess portions of the metal-containing material. A remaining portion of the metal-containing material and a remaining portion of the conductive capping layer in combination form a contact plug.

20 Claims, 16 Drawing Sheets

Related U.S. Application Data continuation of application No. 15/492,113, filed on Apr. 20, 2017, now Pat. No. 10,186,456.

(51) Int. Cl.
| | |
|---|---|
| *H01L 21/768* | (2006.01) |
| *H01L 21/288* | (2006.01) |
| *H01L 29/66* | (2006.01) |
| *H01L 23/485* | (2006.01) |
| *H01L 21/285* | (2006.01) |

(52) U.S. Cl.
CPC .. *H01L 21/76829* (2013.01); *H01L 21/76831* (2013.01); *H01L 21/76849* (2013.01); *H01L 21/76874* (2013.01); *H01L 21/76877* (2013.01); *H01L 21/76879* (2013.01); *H01L 21/76883* (2013.01); *H01L 29/41775* (2013.01); *H01L 29/665* (2013.01); *H01L 29/66477* (2013.01); *H01L 29/66553* (2013.01); *H01L 29/78* (2013.01); *H01L 29/7833* (2013.01); *H01L 21/28518* (2013.01); *H01L 21/76843* (2013.01); *H01L 21/76855* (2013.01); *H01L 21/76873* (2013.01); *H01L 23/485* (2013.01)

(58) Field of Classification Search
CPC ...... H01L 29/7833–29/7836; H01L 29/66477; H01L 29/665; H01L 29/66545; H01L 29/66575; H01L 29/66568; H01L 21/7684; H01L 21/76879; H01L 21/76873; H01L 21/76874; H01L 21/76883; H01L 21/76865

See application file for complete search history.

(56) References Cited

U.S. PATENT DOCUMENTS

| | | | |
|---|---|---|---|
| 8,492,228 B1* | 7/2013 | Leobandung | ... H01L 21/823443 257/308 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,836,129 B1* | 9/2014 | Hung | ... H01L 23/485 257/758 |
| 8,860,148 B2 | 10/2014 | Hu et al. | |
| 9,105,490 B2 | 8/2015 | Wang et al. | |
| 9,147,767 B2 | 9/2015 | Chen et al. | |
| 9,153,483 B2 | 10/2015 | Shieh et al. | |
| 9,209,273 B1 | 12/2015 | Lin et al. | |
| 9,236,267 B2 | 1/2016 | De et al. | |
| 9,236,300 B2 | 1/2016 | Liaw | |
| 9,466,565 B2 | 10/2016 | Bohr et al. | |
| 9,496,362 B1 | 11/2016 | Alptekin et al. | |
| 9,502,265 B1 | 11/2016 | Jiang et al. | |
| 9,520,482 B1 | 12/2016 | Chang et al. | |
| 9,576,814 B2 | 2/2017 | Wu et al. | |
| 9,614,052 B2 | 4/2017 | Su et al. | |
| 9,741,812 B1* | 8/2017 | Adusumilli | ........... H01L 23/485 |
| 10,079,210 B2 | 9/2018 | Lee et al. | |
| 10,141,225 B2 | 11/2018 | Tsai et al. | |
| 10,483,165 B2* | 11/2019 | Wang | ................ H01L 29/41775 |
| 10,510,596 B2 | 12/2019 | Tsai et al. | |
| 2006/0046318 A1 | 3/2006 | Ueda et al. | |
| 2006/0113006 A1 | 6/2006 | Masuda et al. | |
| 2010/0155846 A1 | 6/2010 | Mukherjee et al. | |
| 2011/0062502 A1 | 3/2011 | Yin et al. | |
| 2012/0043592 A1 | 2/2012 | Zhao et al. | |
| 2012/0061698 A1 | 3/2012 | Toscano et al. | |
| 2013/0168255 A1 | 7/2013 | Frederich et al. | |
| 2014/0004693 A1 | 1/2014 | Hoon | |
| 2014/0027822 A1* | 1/2014 | Su | ....................... H01L 29/4966 257/288 |
| 2014/0117550 A1 | 5/2014 | Motoyama et al. | |
| 2014/0120711 A1 | 5/2014 | Tsai et al. | |
| 2014/0199837 A1 | 7/2014 | Hung et al. | |
| 2014/0220777 A1 | 8/2014 | Yang et al. | |
| 2015/0072511 A1 | 3/2015 | Liu et al. | |
| 2015/0279734 A1 | 10/2015 | Chowdhury et al. | |
| 2015/0364371 A1 | 12/2015 | Yen et al. | |
| 2016/0099216 A1 | 4/2016 | Lin et al. | |
| 2017/0005005 A1 | 1/2017 | Chen et al. | |
| 2018/0190785 A1* | 7/2018 | Hung | ................ H01L 21/31053 |

FOREIGN PATENT DOCUMENTS

| | | |
|---|---|---|
| CN | 105280591 A | 1/2016 |
| JP | 2006066514 A | 3/2006 |
| KR | 0172524 B1 | 3/1999 |
| KR | 100727449 B1 | 6/2007 |
| KR | 20150030135 A | 3/2015 |
| KR | 20150093583 A | 8/2015 |
| KR | 20170004827 A | 1/2017 |
| KR | 20170042938 A | 4/2017 |
| WO | 2014105477 A1 | 7/2014 |

* cited by examiner

METHODS FOR FORMING CONTACT PLUGS WITH REDUCED CORROSION

PRIORITY CLAIM AND CROSS-REFERENCE

This application is a continuation of U.S. patent application Ser. No. 16/213,326, entitled "Methods for Forming Contact Plugs with Reduced Corrosion," filed on Dec. 7, 2018, which is a continuation of U.S. patent application Ser. No. 15/492,113, entitled "Methods for Forming Contact Plugs with Reduced Corrosion," filed on Apr. 20, 2017, now U.S. Pat. No. 10,186,456 issued Jan. 22, 2019, which applications are incorporated herein by reference.

BACKGROUND

In the manufacturing of integrated circuits, contact plugs are used for connecting to the source and drain regions and the gates of transistors. The source/drain contact plugs were typically connected to source/drain silicide regions, whose formation includes forming contact openings to expose source/drain regions, depositing a metal layer, performing an anneal to react the metal layer with the source/drain regions, filling tungsten into the remaining contact opening, and performing a Chemical Mechanical Polish (CMP) to remove excess tungsten. A cleaning is then performed. In the CMP and the subsequent cleaning processes, the top surface of the contact plug may suffer from dishing and corrosion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
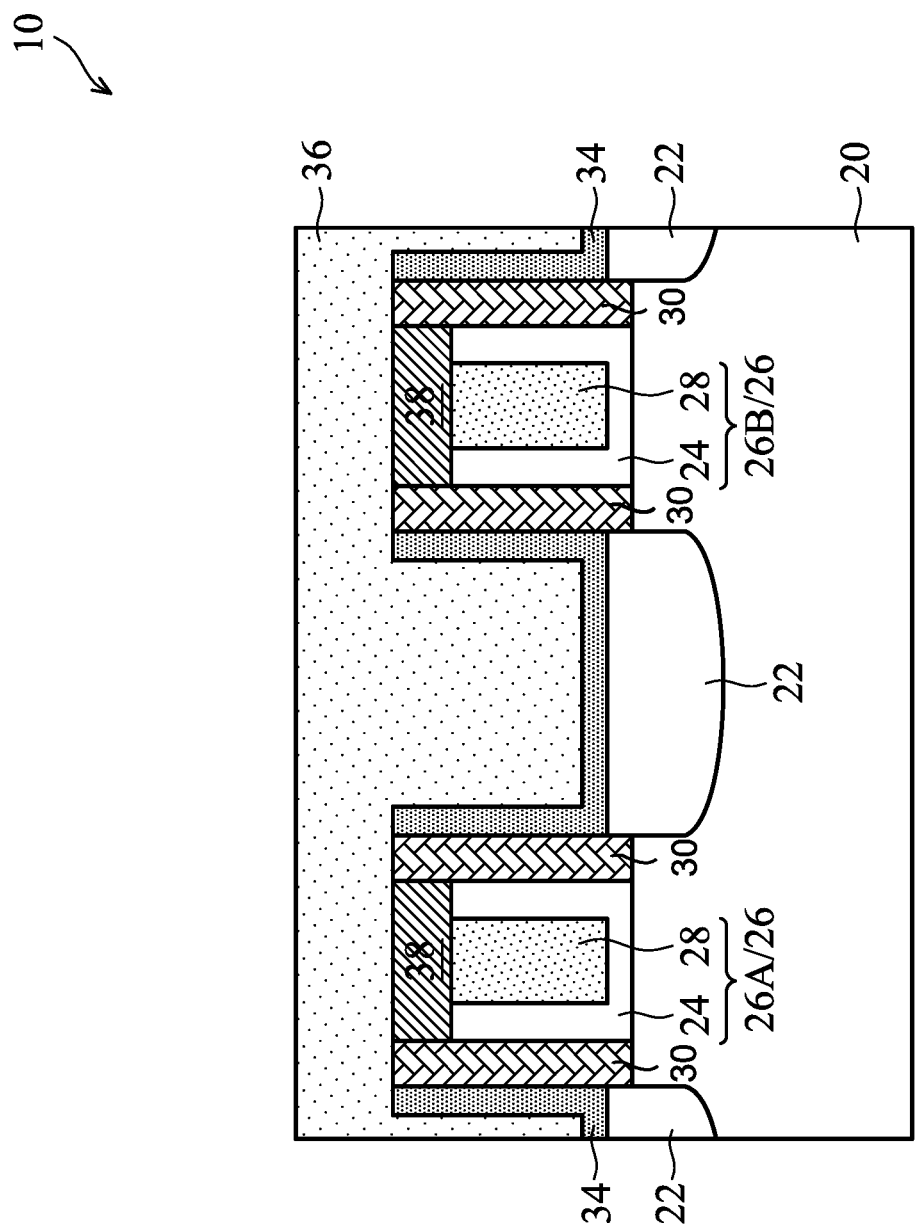
FIGS. 1 through 12 are cross-sectional views of intermediate stages in the formation of a transistor and contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor having contact plugs electrically connected to a source/drain region and a gate electrode, and the method of forming the same are provided in accordance with various exemplary embodiments. The intermediate stages of forming the transistor are illustrated. The variations of some embodiments are discussed. Throughout the various views and illustrative embodiments, like reference numbers are used to designate like elements.

Figure 14:
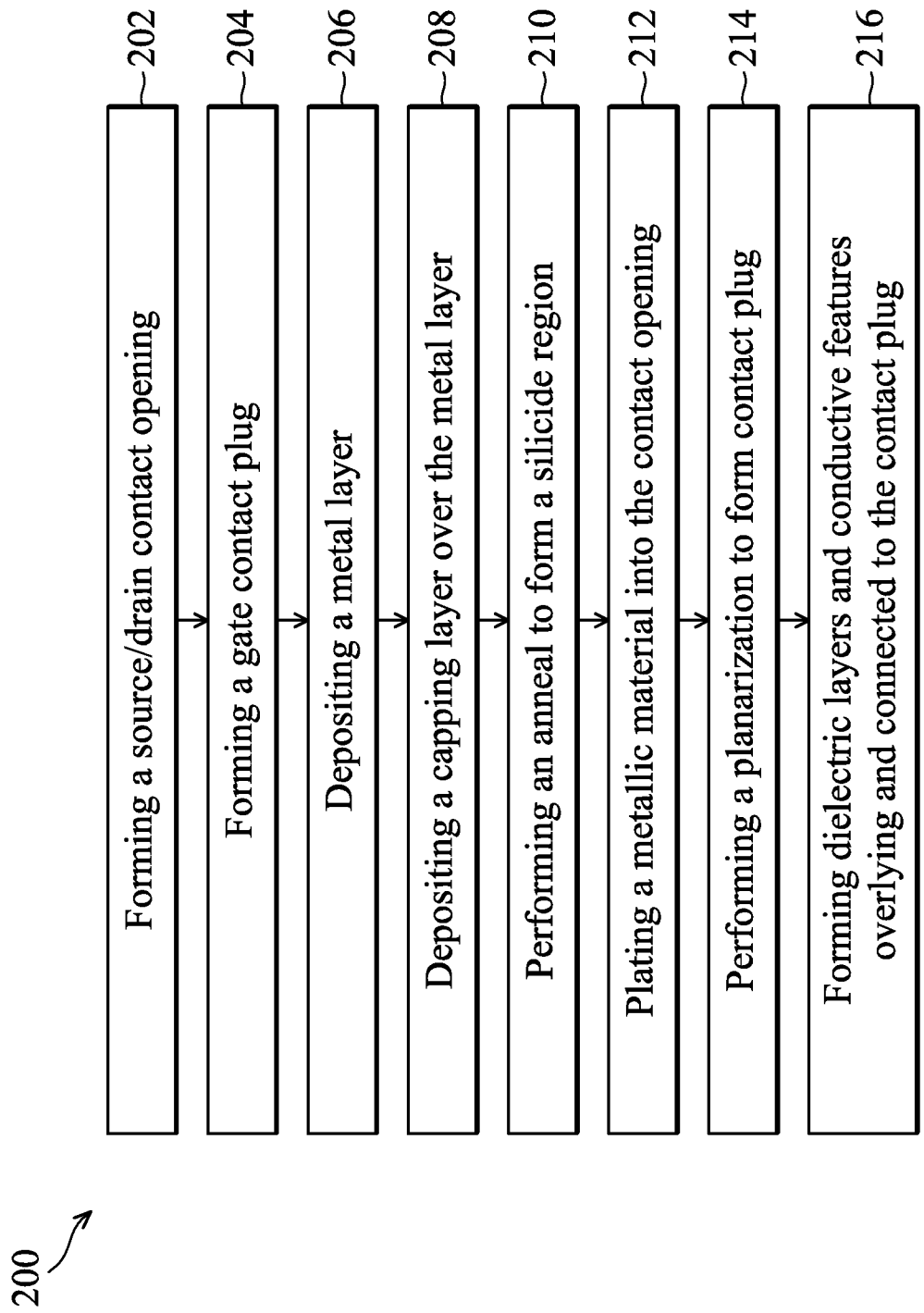
FIG. 14 illustrates a process flow for forming a transistor in accordance with some embodiments.

FIGS. 1 through 12 are cross-sectional views of intermediate stages in the formation of a transistor and the respective contact plugs in accordance with some exemplary embodiments. The steps shown in FIGS. 1 through 12 are also illustrated schematically in the process flow 200 as in FIG. 14. Referring to FIG. 1, the initial structures on wafer 10 are formed. Wafer 10 includes substrate 20, which may be formed of a semiconductor material such as silicon, silicon germanium, silicon carbon, a III-V compound semiconductor material, or the like. Substrate 20 may be a bulk substrate or a Semiconductor-On-Insulator (SOI) substrate.

Gate stacks 26A and 26B, which are collectively referred to as gate stacks 26, are formed over substrate 20. In accordance with some embodiments of the present disclosure, gate stacks 26A and 26B are formed as gate stack strips (in a top view of wafer 10) having lengthwise directions parallel to each other. Each of gate stacks 26A and 26B may include gate dielectric 24, gate electrode 28 over gate dielectric 24, and hard mask 38 over gate electrode 28. In accordance with some embodiments of the present disclosure, gate stacks 26 are replacement gate stacks, which are formed by forming dummy gate stacks (not shown), removing the dummy gate stacks to form recesses, and forming the replacement gates in the recesses. As a result, each of gate dielectrics 24 includes a bottom portion underlying the respective gate electrode 28, and sidewall portions on the sidewalls of the respective gate electrode 28. The sidewall portions form rings encircling the respective gate electrodes 28.

Figure 2:
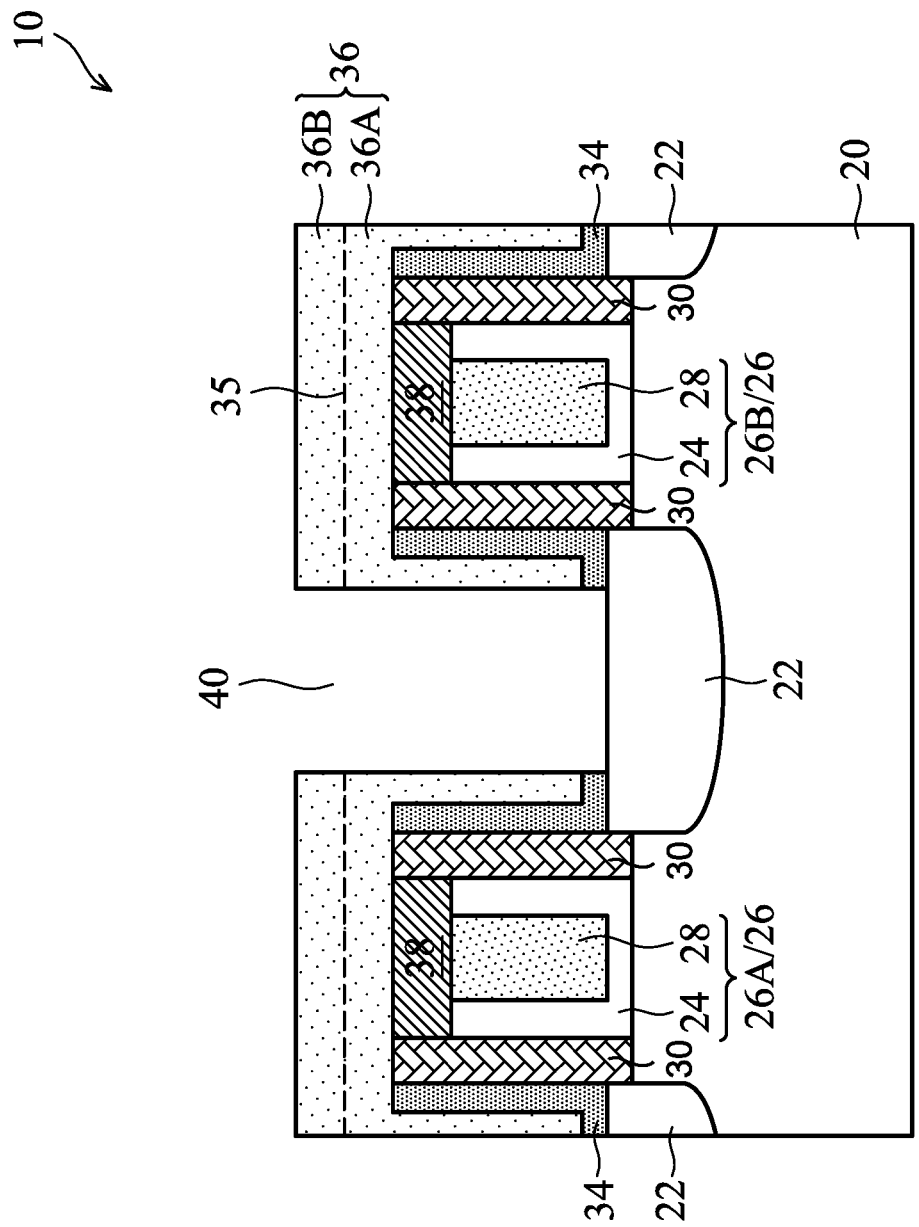

In accordance with some embodiments of the present disclosure, source and drain regions 22 (referred to as source/drain regions 22 hereinafter) are formed to extend into substrate 20, and is formed before the formation of Contact Etch Stop Layer (CESL) 34, Inter-Layer Dielectric (ILD) 36, and the contact opening therein. In accordance with alternative embodiments, source/drain regions 22 are formed after the formation of the contact opening as shown in FIG. 2. One or more of source/drain regions 22 may be a common source region or a common drain region shared by neighboring gate stacks including 26A and 26B. Accordingly, gate stack 26A may form a first transistor in combination with the source/drain regions 22 on the opposite sides of gate stack 26A, and gate stack 26B may form a second transistor in combination with the source/drain regions 22 on the opposite sides of gate stack 26B. The first transistor and the second transistor may be electrically connected in parallel to act as a single transistor.

Gate dielectric 24 may be a single layer or a composite layer that includes a plurality of layers. For example, gate dielectric 24 may include an interfacial oxide layer and a high-k dielectric layer over the oxide layer. The oxide layer may be a silicon oxide layer formed through thermal oxidation or chemical oxidation. The high-k dielectric layer may have a k value greater than 7, or even greater than 20. Exemplary high-k dielectric materials include hafnium oxide, zirconium oxide, lanthanum oxide, and the like.

In accordance with some embodiments of the present disclosure, each gate electrode 28 has a single-layer structure formed of a homogeneous conductive material. In accordance with alternative embodiments, each gate electrode 28 has a composite structure including a plurality of layers formed of TiN, TaSiN, WN, TiAl, TiAlN, TaC, TaN, aluminum, or alloys thereof. The formation of gate electrodes 28 may include Physical Vapor Deposition (PVD), Metal-Organic Chemical Vapor Deposition (MOCVD), and/or other applicable methods. Hard masks 38 may be formed of silicon nitride or silicon oxynitride, for example.

In accordance with alternative embodiments of the present disclosure, rather than being replacement gate stacks, gate stacks 26A and 26B are formed by depositing a blanket gate dielectric layer and a blanket gate electrode layer (such as a polysilicon layer), and then patterning the blanket gate dielectric layer and the blanket gate electrode layer.

Referring again to FIG. 1, Contact Etch Stop Layer (CESL) 34 is formed to cover substrate 20, and may extend on the sidewalls of gate spacers 30. In accordance with some embodiments of the present disclosure, CESL 34 is formed of silicon nitride, silicon carbide, or other dielectric materials. Inter-Layer Dielectric (ILD) 36 (alternatively referred to as ILD0 36) is formed over CESL and gate stacks 26A and 26B. ILD 36 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like. ILD 36 may include a first layer having a top surface level with the top surfaces of gate stacks 26A and 26B, and gate stacks 26A and 26B are replacement gates formed in the first layer. ILD 36 may further include a second layer formed over the first layer, and the second layer is formed after the formation of gate stacks 26A and 26B. The first and the second layers may be formed of a same material or different materials, and may or may not have a distinguishable interface in between.

Referring to FIG. 2, ILD 36 and CESL 34 are etched to form source/drain contact opening 40. The respective step is illustrated as step 202 in the process flow shown in FIG. 14. Source/drain region 22 (if already formed) is exposed to contact opening 40. The etching is anisotropic, so that the sidewalls of opening 40 are substantially vertical.

In accordance with some embodiments in which source/drain regions 22 have not been formed yet at this time, a Pre-Amorphization Implantation (PAI) and a source/drain implantation may be performed to form source/drain regions 22, and the species of the PAI and the implanted impurity for forming source/drain regions 22 are implanted into substrate 20 through opening 40. The PAI may be performed using germanium, silicon, or the like, which destroys the lattice structure of the implanted regions in order to control the depth of the subsequent source/drain implantation. The source/drain implantation may be performed using boron or indium if the respective transistor is a p-type transistor, or using phosphorous, arsenic, or antimony if the respective transistor is an n-type transistor.

In accordance with some embodiments, ILD 36 is formed of a homogenous dielectric material. In accordance with alternative embodiments, as shown in FIG. 2, dashed line 35 is drawn to show that ILD 36 may include layer 36A and layer 36B over layer 36A. Layers 36A and 36B are both dielectric layers. Layer 36B may be formed of a dielectric material different from the material of layer 36A. For example, both layer 36A and layer 36B may be formed of dielectric materials selected from the same group of candidate dielectric materials for forming ILD such as PSG, BSG, BPSG, and TEOS, while different materials are selected. In subsequent formation, layer 36B may be removed, and hence is used as a sacrificial layer.

Figure 3:
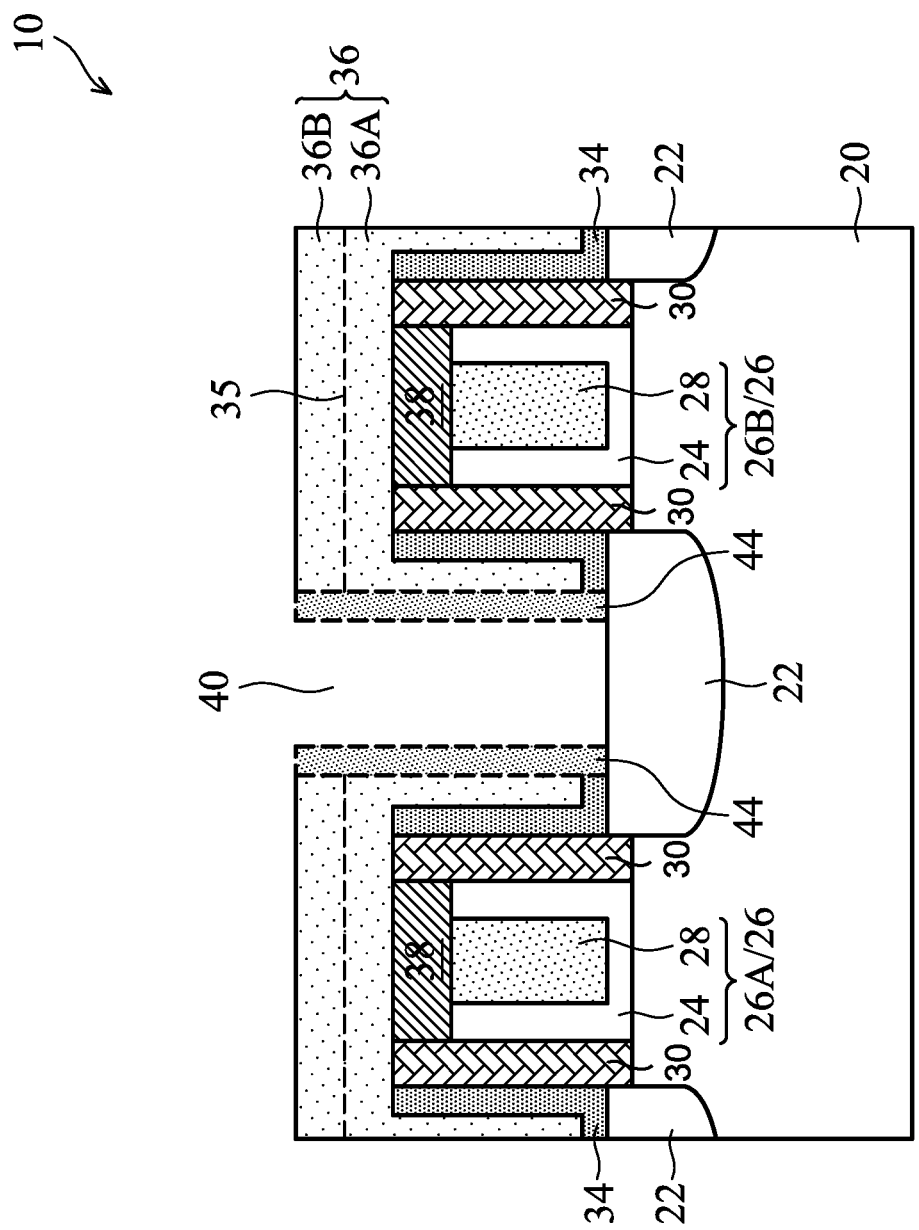

FIG. 3 illustrates the formation of dielectric contact (plug) spacers 44 in accordance with some embodiments of the present disclosure. In accordance with alternative embodiments, contact spacers 44 are not formed. The formation of contact spacers 44 may include depositing one or a plurality of conformal dielectric layer(s). The dielectric layer extend into contact opening 40, and includes vertical portions on the sidewalls of ILD 36, and horizontal portions at the bottom of opening 40 as well as over ILD 36. The deposition process is performed using a conformal deposition process such as Atomic Layer Deposition (ALD), CVD, or the like, so that the horizontal portions and vertical portions of the deposited layer have similar thicknesses. An anisotropic etching is then performed to remove the horizontal portions of the dielectric layer, leaving the vertical portions as contact spacers 44. The anisotropic etching may be performed using ammonia ($NH_3$) and $NF_3$ as etching gases. It is noted that contact spacers 44 in the same opening 40, when viewed in a top view of wafer 10, are portions of an integrated spacer ring.

In accordance with some embodiments of the present disclosure, spacers 44 are formed of a dielectric material that has a high etching selectivity relative to oxide, so that in subsequent cleaning processes (in which oxides are removed), spacers 44 are not damaged. For example, contact spacers 44 may be formed of silicon nitride, silicon oxycarbide, silicon oxynitride, or the like.

Figure 4:
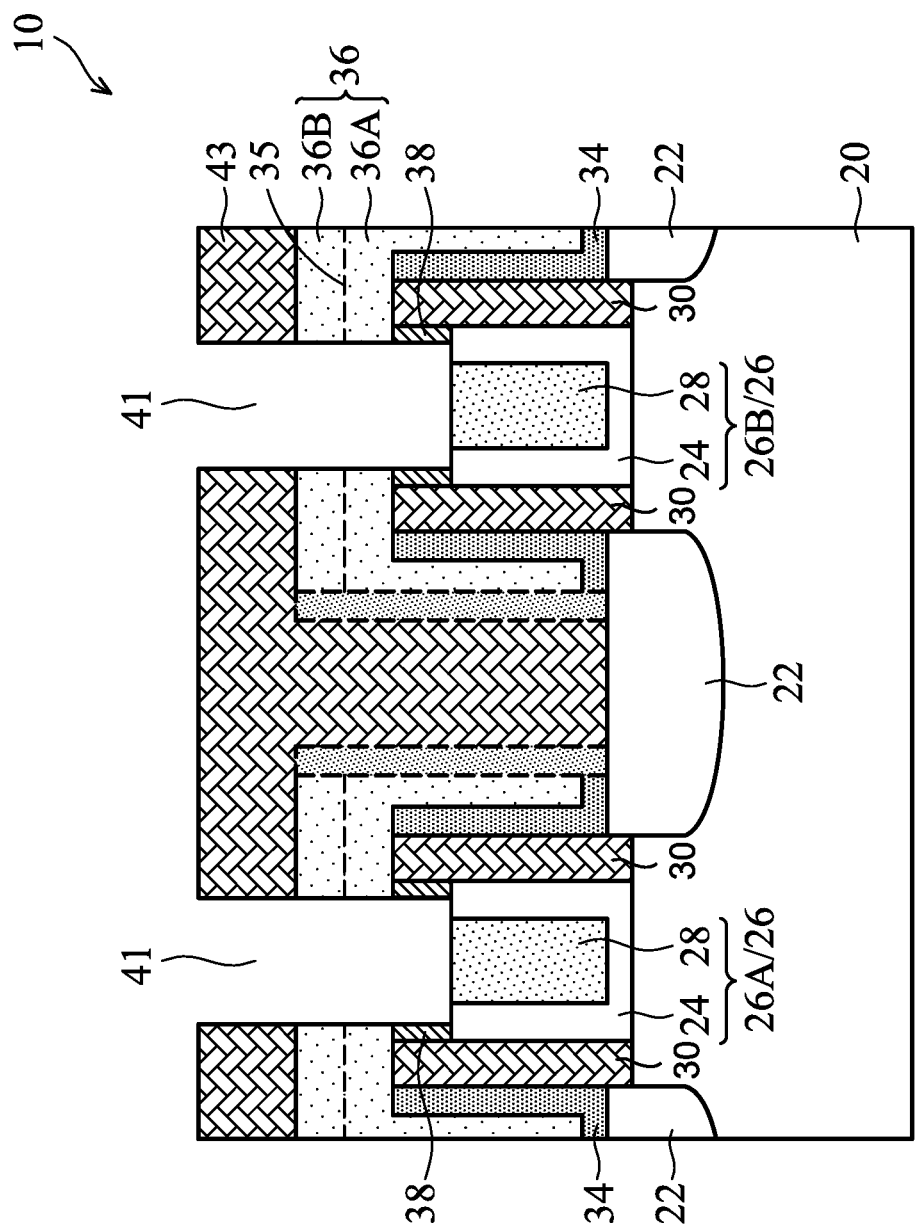

Referring to FIG. 4, a lithography mask such as photo resist 43 is formed over ILD 36. Photo resist 43 fills source/drain contact opening 40 (FIG. 3). Photo resist 43 is then patterned. An etching process(es) is performed using photo resist 43 as an etching mask to etch ILD 36, so that gate contact openings 41 are formed. The respective step is illustrated as step 204 in the process flow shown in FIG. 14. Hard masks 38 are then etched, and openings 41 extend into the space between opposite gate spacers 30. Gate electrodes 28 (and possibly gate dielectrics 24) are thus exposed to gate contact openings 40. In accordance with some embodiments of the present disclosure, the formation of openings 41 includes an anisotropic etch to etch-through ILD 36, and an isotropic etch (dry etch) or an anisotropic etch (dry etch or wet etch) to etch hard masks 38. The sidewalls of gate spacers 30 may be or may not be exposed to openings 42 after the etching.

Figure 5:
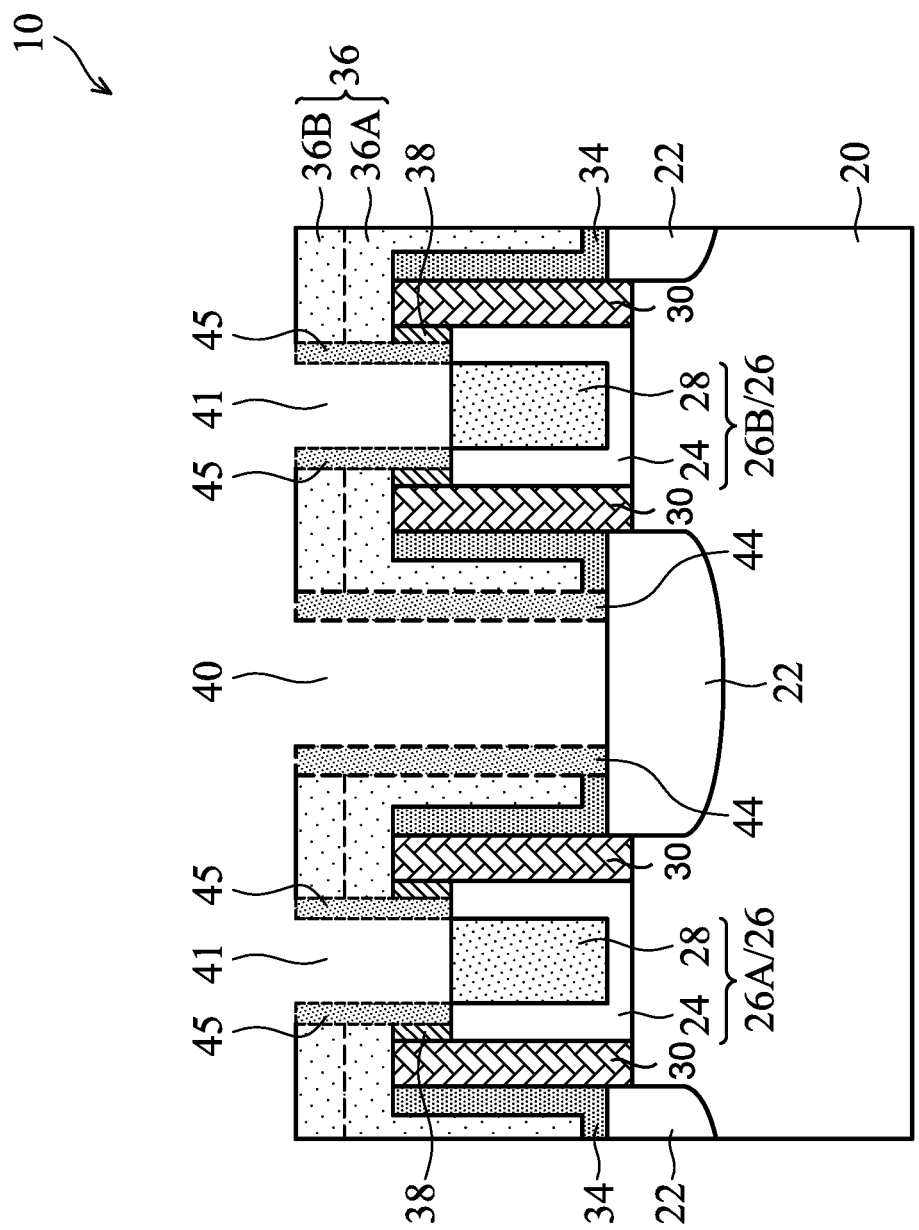

In accordance with some embodiments, as shown in FIG. 5, contact spacers 45 are formed in openings 41. In accordance with alternative embodiments, contact spacers 45 are omitted. Contact spacers 45 may be formed of a material selected from the same group of candidate materials for forming contact spacers 44. Contact spacers 44 and 45 may be formed of a same material or different materials. In accordance with some embodiments, contact spacers 44 and 45 are formed in different processes, each following the formation of the respective contact openings 40 and 41. In accordance with alternative embodiments, contact spacers 44 and 45 are formed after both contact openings 40 and 41 are formed, and are formed in a common formation process, which includes depositing a blanket dielectric layer, and then performing an anisotropic etching on the blanket dielectric layer. The formation of either one or both of contact spacers 44 and 45 may also be omitted, and the subsequently formed contact plug(s) will be in contact with ILD 36.

Figure 6:
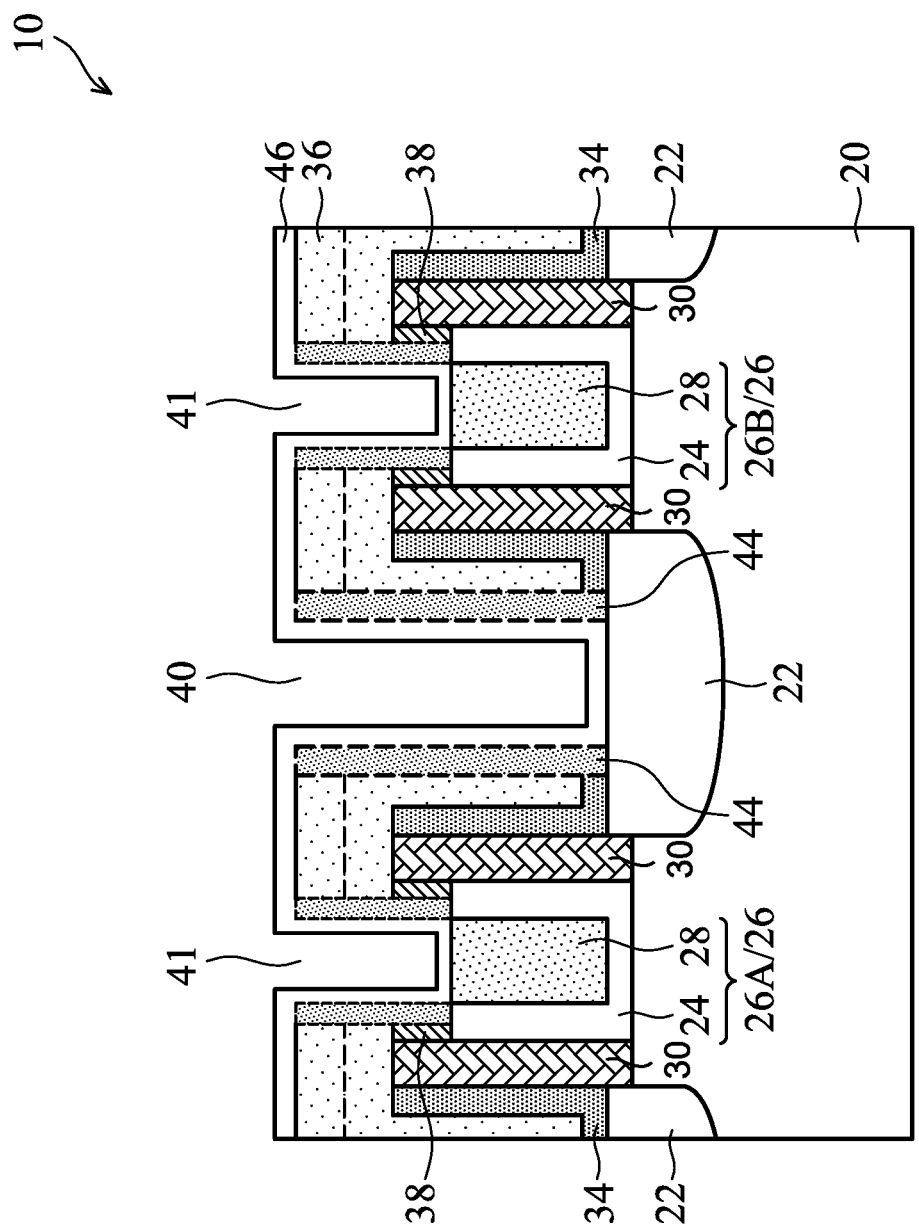

Next, referring to FIG. 6, metal layer 46 is deposited. The respective step is illustrated as step 206 in the process flow shown in FIG. 14. In accordance with some embodiments of the present disclosure, metal layer 46 is a titanium (Ti) layer, which may be formed using Physical Vapor Deposition (PVD). Metal layer 46 includes a bottom portion at the bottom of opening 40, and sidewall portions on the sidewall surfaces of ILD 36. Metal layer 46 has two functions. The first function is that the bottom portion of metal layer 46 reacts with the underlying source/drain region 22 to form a source/drain silicide region. The second function is that metal layer 46 acts as an adhesion layer for the subsequently formed capping layer.

In accordance with alternative embodiments, openings 40 and 41 are filled in different processes, and metal layer 46 is filled into opening 40, and not into openings 41. Conductive capping layer 48 and metallic material 54, however, are still filled into both openings 40 and 41 in accordance with these embodiments.

Figure 7:
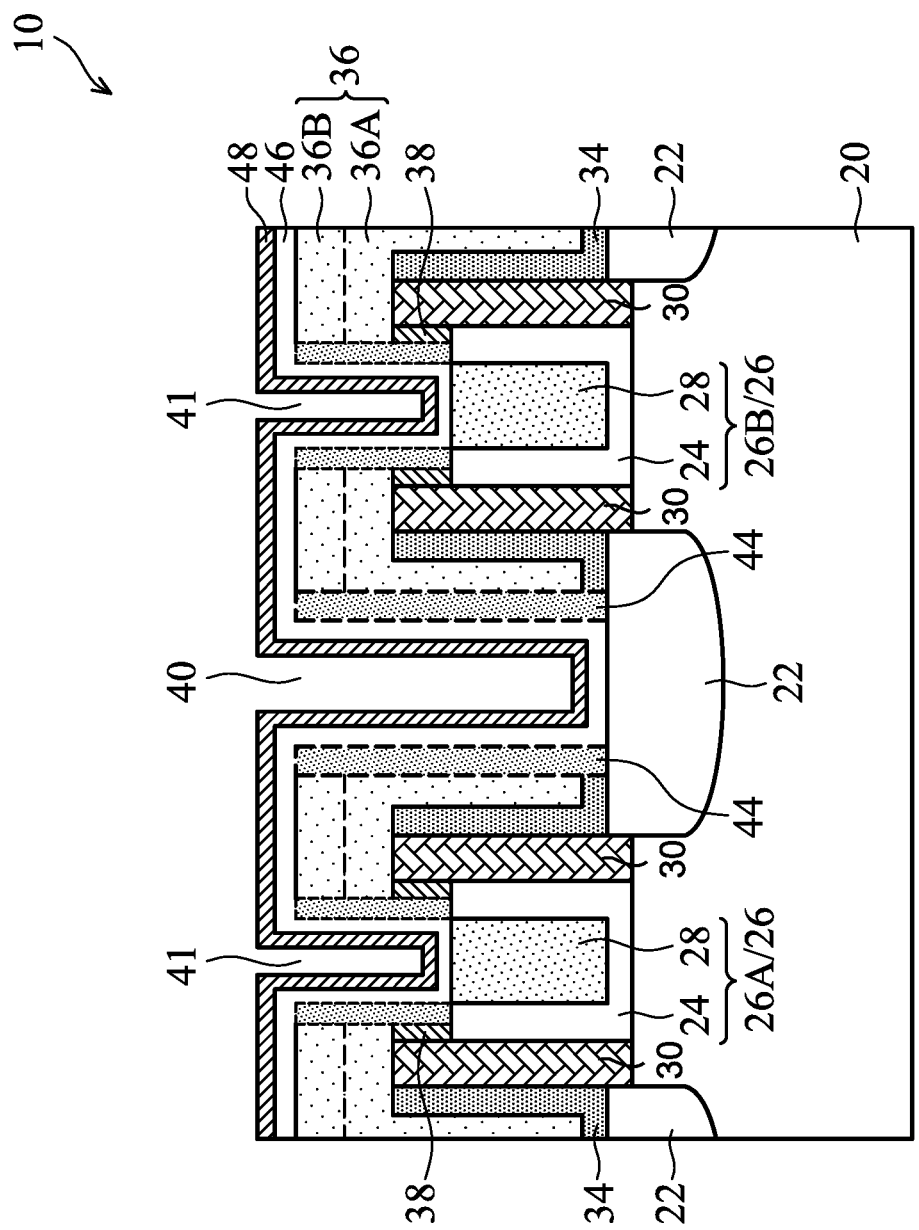

Referring to FIG. 7, conductive capping layer 48 is deposited. The respective step is illustrated as step 208 in the process flow shown in FIG. 14. Capping layer 48 also acts as a diffusion barrier layer. In accordance with some embodiments of the present disclosure, capping layer 48 is formed of a metal nitride such as titanium nitride. Capping layer 48 may be formed using PVD, CVD, or the like.

Figure 8:
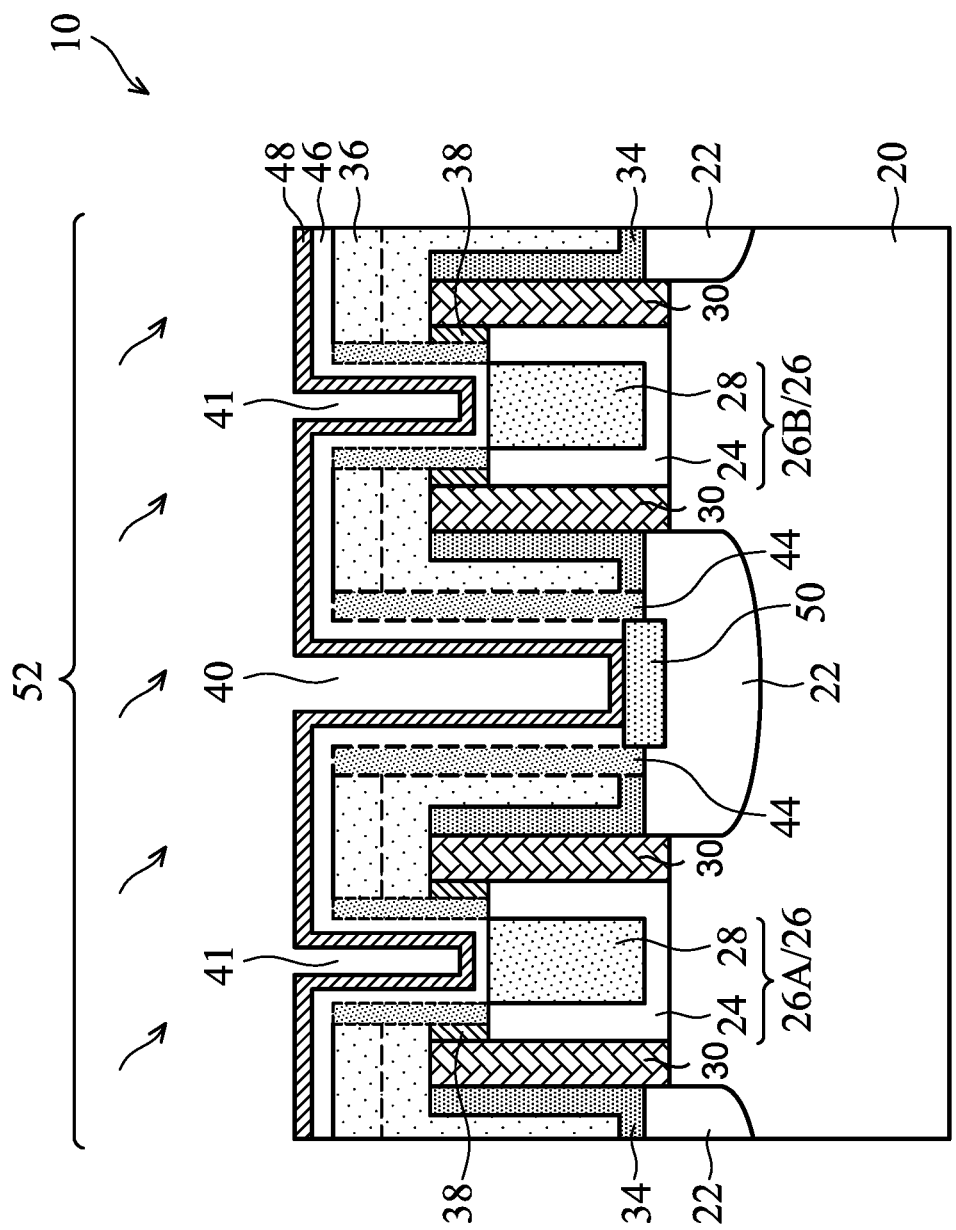

FIG. 8 illustrates a silicidation process for forming source/drain silicide region 50. In accordance with some embodiments of the present disclosure, the silicidation process is performed through an anneal, which is represented by arrows 52. The respective step is illustrated as step 210 in the process flow shown in FIG. 14. The anneal may be performed through Rapid Thermal Anneal (RTA), furnace anneal, or the like. Accordingly, the bottom portion of metal layer 46 reacts with source/drain region 22 to form silicide region 50. The sidewall portions of metal layer 46 remain after the silicidation process. In accordance with some embodiments of the present disclosure, the bottom portion of metal layer 46 is fully reacted, and the top surface of silicide region 50 is in contact with the bottom surface of capping layer 48.

Figure 9:
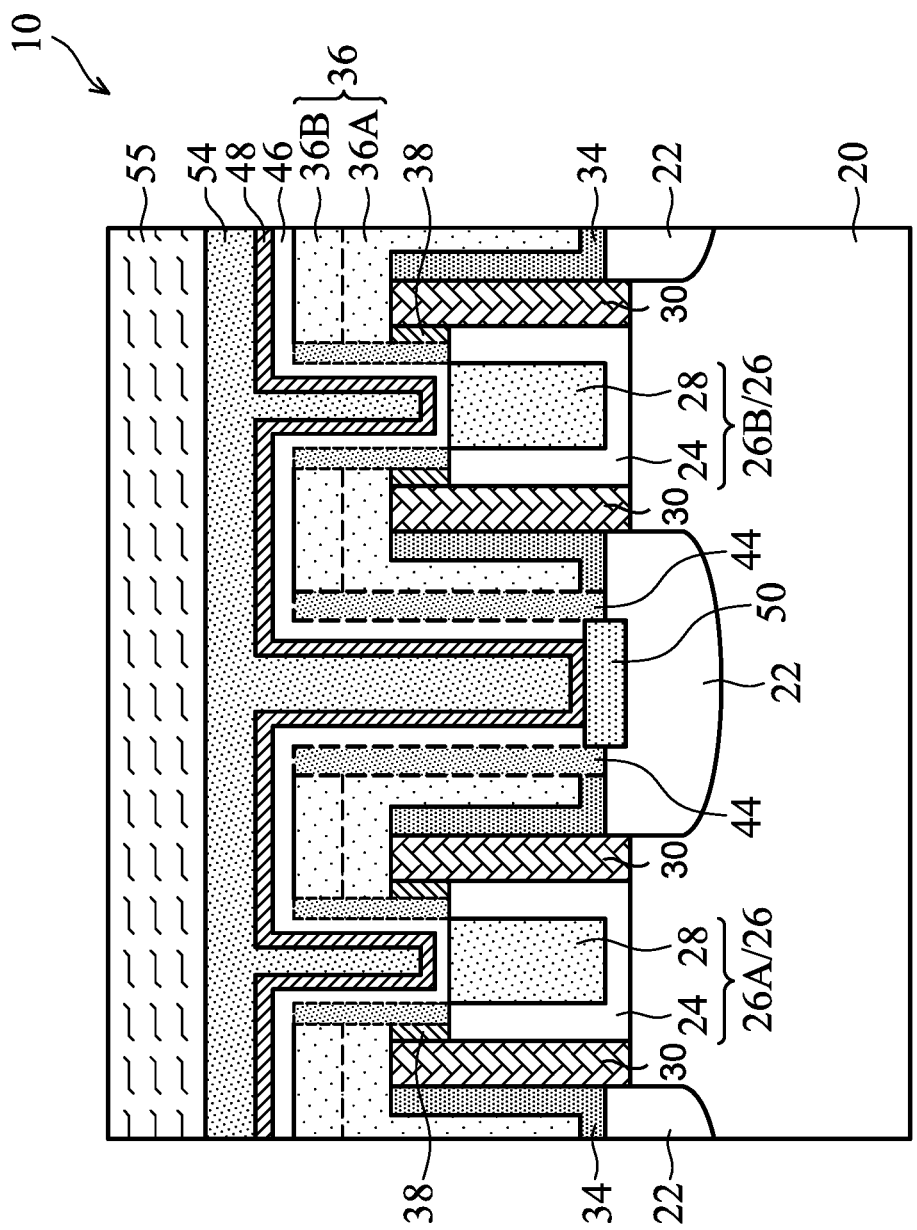

Next, metallic material 54 is filled into the remaining contact openings 40 and 41, and the resulting wafer 10 is shown in FIG. 9. The respective step is illustrated as step 212 in the process flow shown in FIG. 14. Metallic material 54 may be formed of a cobalt-containing material or a tungsten-containing material, which may be formed of pure or substantially pure tungsten or cobalt (for example, with an atomic percentage greater than about 95 percent).

In accordance with some embodiments of the present disclosure, the formation of metallic material 54 is performed through ElectroChemical Plating (ECP). During an ECP, a plating solution (schematically illustrated as 55) is in contact with wafer 10, and a current is conducted through plating solution 55. For example, the plating may be performed by submerging wafer 10 into the plating solution 55. In accordance with some embodiments, plating solution 55 includes a metal-containing chemical such as Boric acid, $CoSO_4$ in $H_2SO_4$ and additional chemical(s) such as organic compounds with C—H and/or N—H bonds.

Plating solution 55 may include sulfur (S) in its electrolyte. As a result, the plated metallic material 54 also includes sulfur. The sulfur in metallic material 54 will cause the corrosion of metallic material 54 in subsequent steps, as will be discussed in subsequent paragraphs. Accordingly, the sulfur content in the electrolyte is reduced or eliminated before the plating. In accordance with some embodiments of the present disclosure, plating solution 55 is free from any sulfur-containing chemical, so that no sulfur will be deposited into metallic material 54. In accordance with alternative embodiments, plating solution 55 is adjusted, so that although there is sulfur-containing chemical (such as organic compounds including sulfur and having C—H and/or N—H bonds, the amount of sulfur in plating solution 55 is lower than 100 Parts Per Million (ppm). Plating solution 55 may also be substantially free from sulfur, for example, with the amount of sulfur in plating solution 55 being lower than about 20 ppm or lower than about 10 ppm, so that the corrosion of metallic material 54, if any, will not affect the quality of the resulting contact plugs. If plating solution 55 has already been purchased (or provided) and has a sulfur content higher than about 100 ppm, plating solution 55 is processed to remove sulfur in order to reduce the sulfur content to lower than 100 ppm, and to a desirable level such as lower than about 20 ppm or 10 ppm before used for plating, and the plating solution 55 used for plating may be free or substantially free from sulfur. Also, plating solution 55 may have a small amount of sulfur content, which may be more than about 1 ppm, for example, and hence the sulfur content may be in the range between about 1 ppm and about 100 ppm, in the range between about 1 ppm and about 20 ppm, or in the range between about 1 ppm and about 10 ppm. The resulting metallic material 54 may include a trace amount of sulfur, with the amount significantly reduced or fully eliminated due to the reduction or the elimination of sulfur in plating solution 55.

The ECP of metallic material 54 may be bottom-up, which means at the bottoms of contact openings 40 and 41 (FIG. 8), the deposition rate is much higher than in upper regions such as on the portions of capping layer 48 over ILD 36. Accordingly, metallic material 54 fills openings 40 and 41, and continues to grow up.

After metallic material 54 is deposited, an anneal is performed, in accordance with some embodiments of the present disclosure, the anneal is performed using Rapid Thermal Anneal (RTA), and the duration of the anneal may be in the range between about 2 minutes and about 10 minutes. The temperature of the anneal may be in the range between about 300° C. and about 500° C. If sulfur exists in metallic material 54, the anneal will cause the diffusion of sulfur, and the sulfur content at the interface between metallic material 54 and capping layer 48 increases as a result of the diffusion.

Figure 10A:
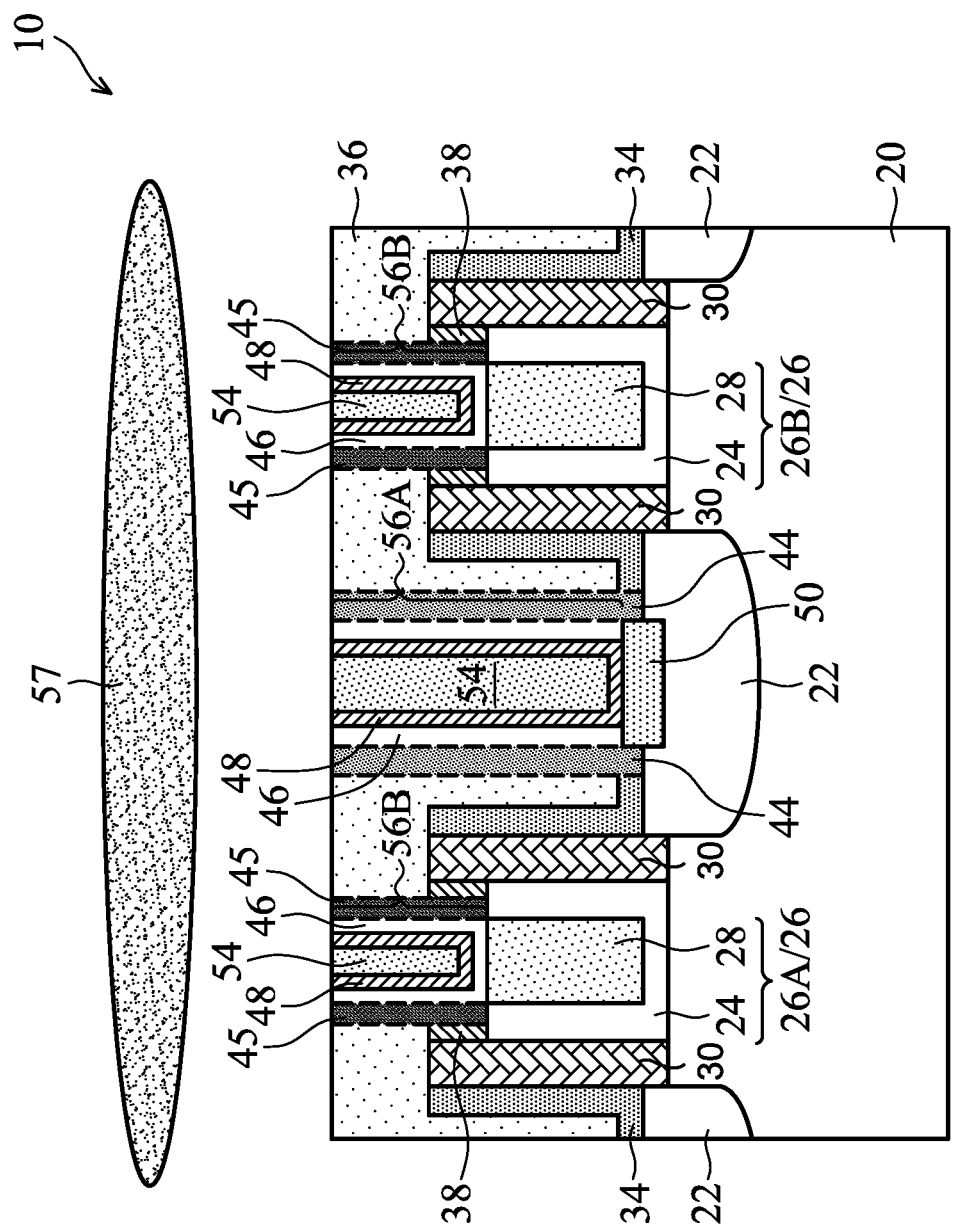

Next, a planarization process such as a Chemical Mechanical Polish (CMP) is performed to remove the excess portions of metallic material 54, capping layer 48, and metal layer 46 over ILD 36. Source/drain contact plug 56A and gate contact plugs 56B are thus formed, as shown in FIG. 10A. The respective step is illustrated as step 214 in the process flow shown in FIG. 14. FIG. 10A schematically illustrates polish pad 57. In the actually CMP process, polish pad 57 may have a size/diameter greater than the size of wafer 10. During the CMP process, polish pad 57 may face up, while wafer 10 may face down and is pressed against polish pad 57. Wafer 10 is rotated during the CMP. A slurry (not shown) is dispensed on polish pad 57 during the CMP.

In accordance with some embodiments in which ILD 36 includes layers 36A and 36B (FIG. 9), the planarization process may be performed until layer 36B is fully removed. Accordingly, layer 36B acts as a sacrificial layer protecting the underlying ILD 36A.

Figure 10B:
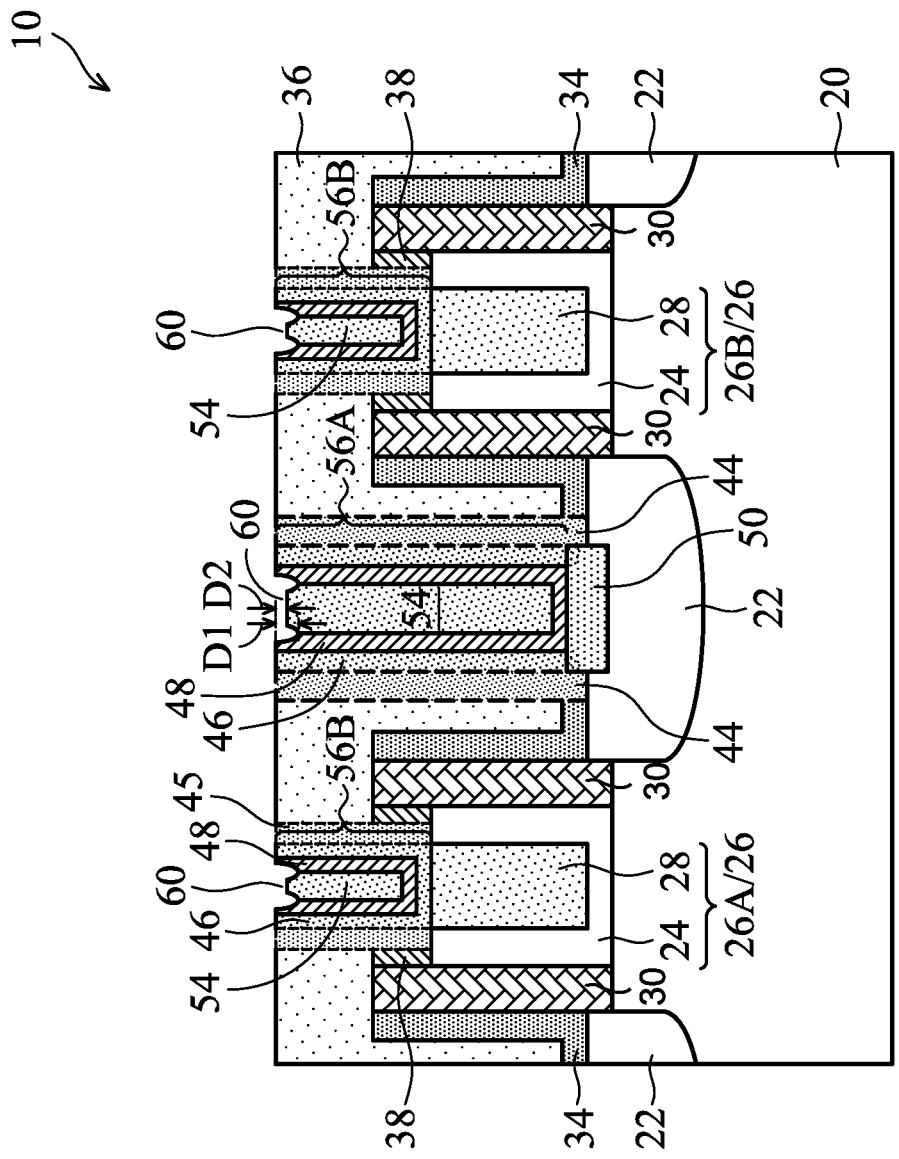

It is found that if sulfur exists in metallic material 54, during the CMP, contact plugs 56A and 56B may be corroded to form recesses 60, as shown in FIG. 10B. Conversely, if no sulfur exists in metallic material 54, during the CMP, no corrosion occurs, and the top surfaces of contact plugs 56A and 56B may be planar with no recess formed. The corrosion may be caused by the reaction of sulfur with the slurry to form sulfuric acid, which corrodes contact plugs 56A and 56B. The anneal further causes the concentration of sulfur in the regions close to the interface between metallic material 54 and capping layer 48. Accordingly, the concentrated sulfur at the interface causes recesses 60 to be deeper adjacent to the interface than in other portions of contact plugs 56A and 56B, and the recessing profile as shown in FIG. 10B is formed. The edge portions of recesses 60 have depth D1, and the center portion of recess 60 has depth D2 smaller than D1. In accordance with some embodiments, ratio D1/D2 is greater than 2.0. It is appreciated that depths D1 and D2 and ratio D1/D2 are related to various factors such as the sulfur content in metallic material 54, the anneal condition, and the slurry. Sulfur may also be diffused into a shallow portion of capping layer 48. Accordingly, recesses 60 may also expand into metal capping layer 48.

Figure 11A:
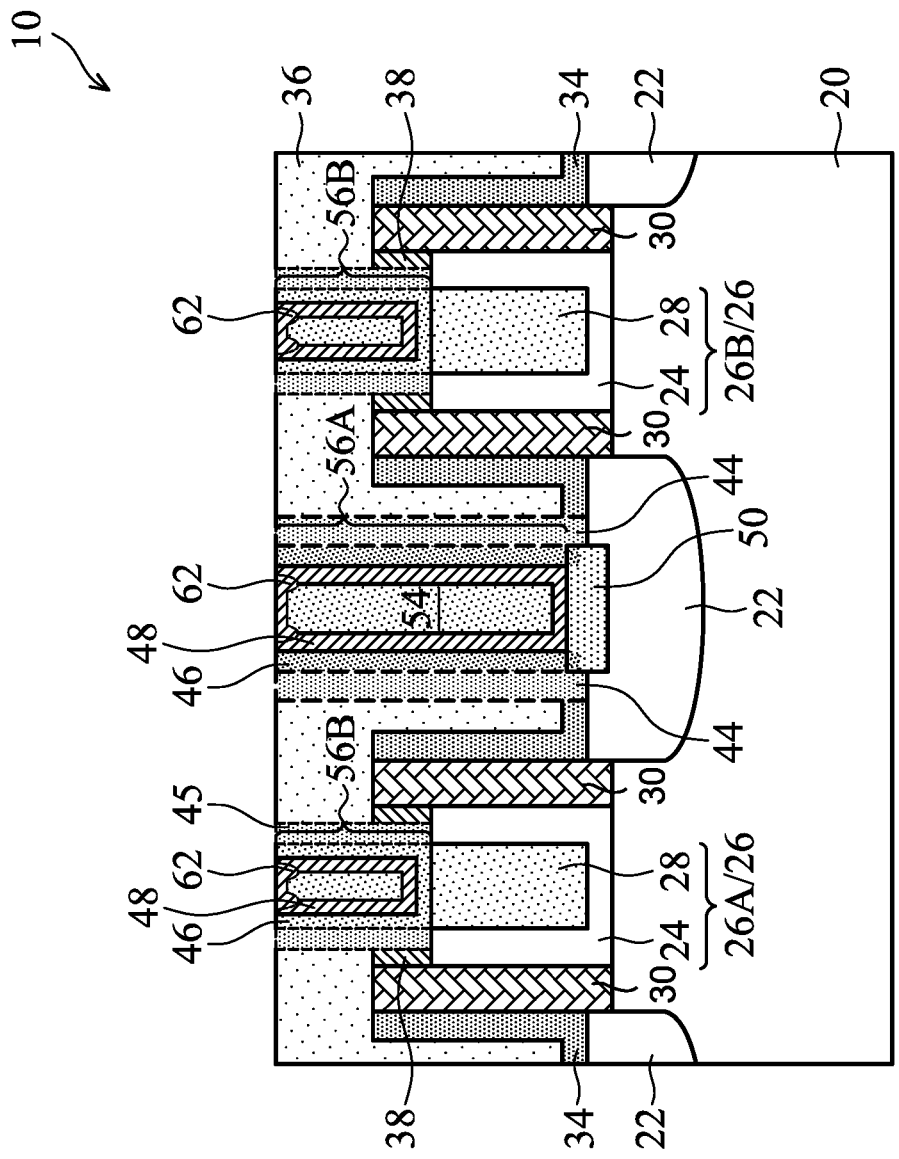

When no corrosion occurs, or the corrosion is very light, dielectric layers and conductive features may be formed directly on the wafer 10 shown in FIG. 10A. If the corrosion still occurs and is not negligible, metal caps 62 may be formed to fill the recesses 60 as shown in FIG. 10B, and the resulting wafer 10 is shown in FIG. 11A. Metal caps 62 thus extend into recesses 60. In accordance with some exemplary embodiments, the top surfaces of metal caps 62 are substantially coplanar with the top surfaces of ILD 36. Metal caps 62 may be deposited using CVD, and a precursor is selected so that the formation is selective, and metal caps 62 are formed on contact plugs 56A and 56B, and not on ILD 36. Metal caps 62 may be formed of cobalt, tungsten, nickel, or alloys thereof. Furthermore, metal caps 62 and metallic material 54 may be formed of a same material or different materials. In FIG. 11A and the subsequent figures, metal caps 62 are shown using dashed lines to indicate they may not be formed in response to the structure shown in FIG. 10A, or may be formed in response to the structure shown in FIG. 10B.

Figure 11B:
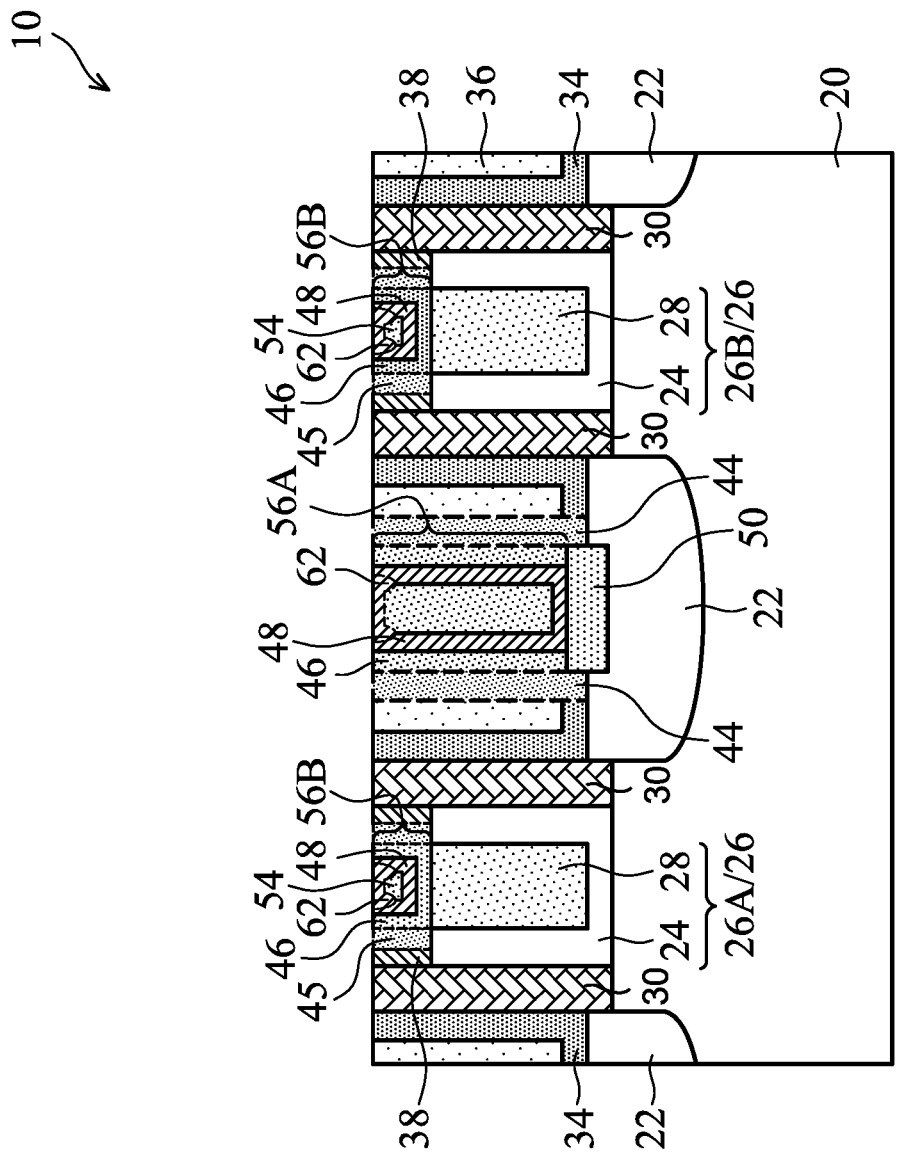

FIG. 11B illustrates wafer 10 in accordance with some embodiments, and the CMP is performed until all of ILD 36 over gate spacers 30 are removed, and gate spacers 30 are exposed. As a result, each of gate contact plugs 56B is fully in the space between opposite gate spacers 30. In accordance with these embodiments, the corrosion of contact plugs 56A and 56 may or may not occur, and as the results, metal caps 62 may or may not be formed, as indicated by the dashed lines for showing metal caps 62.

Figure 12:
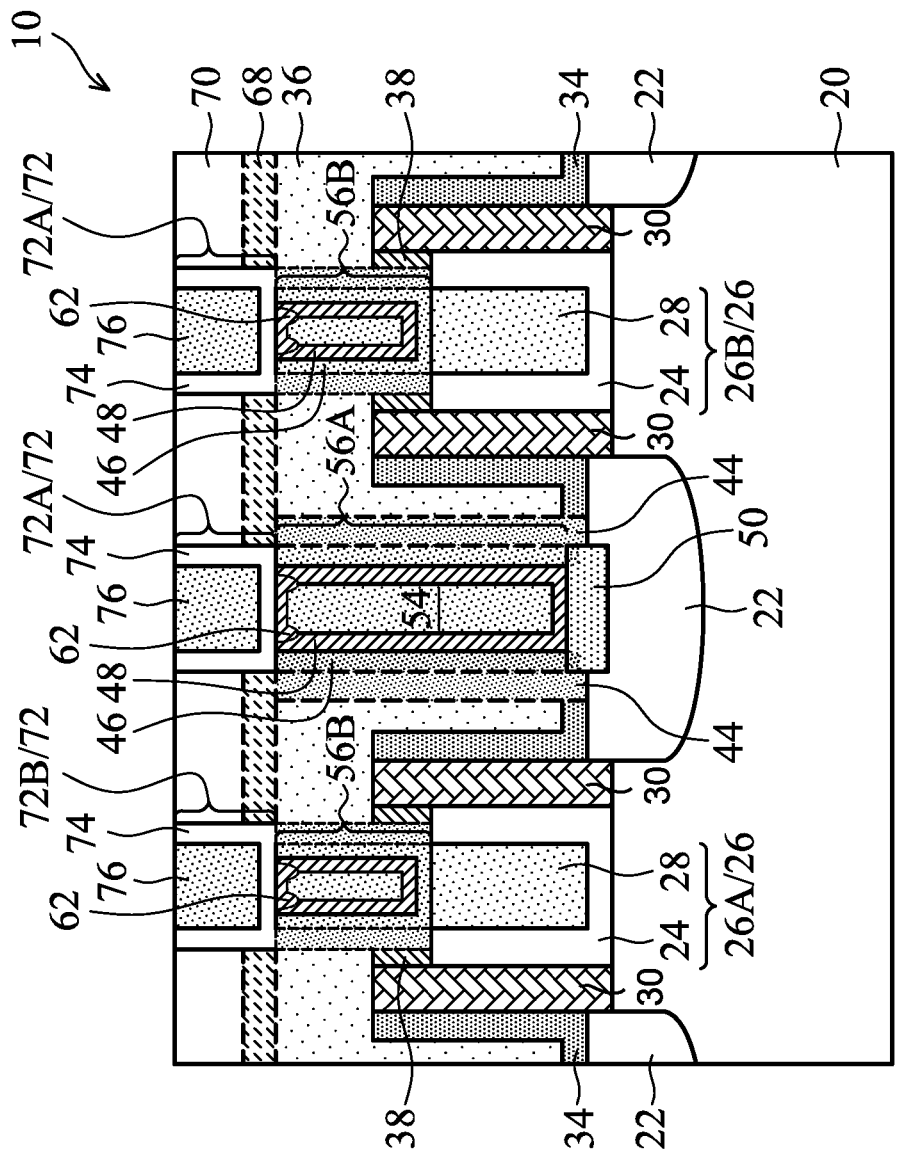
Figure 13:
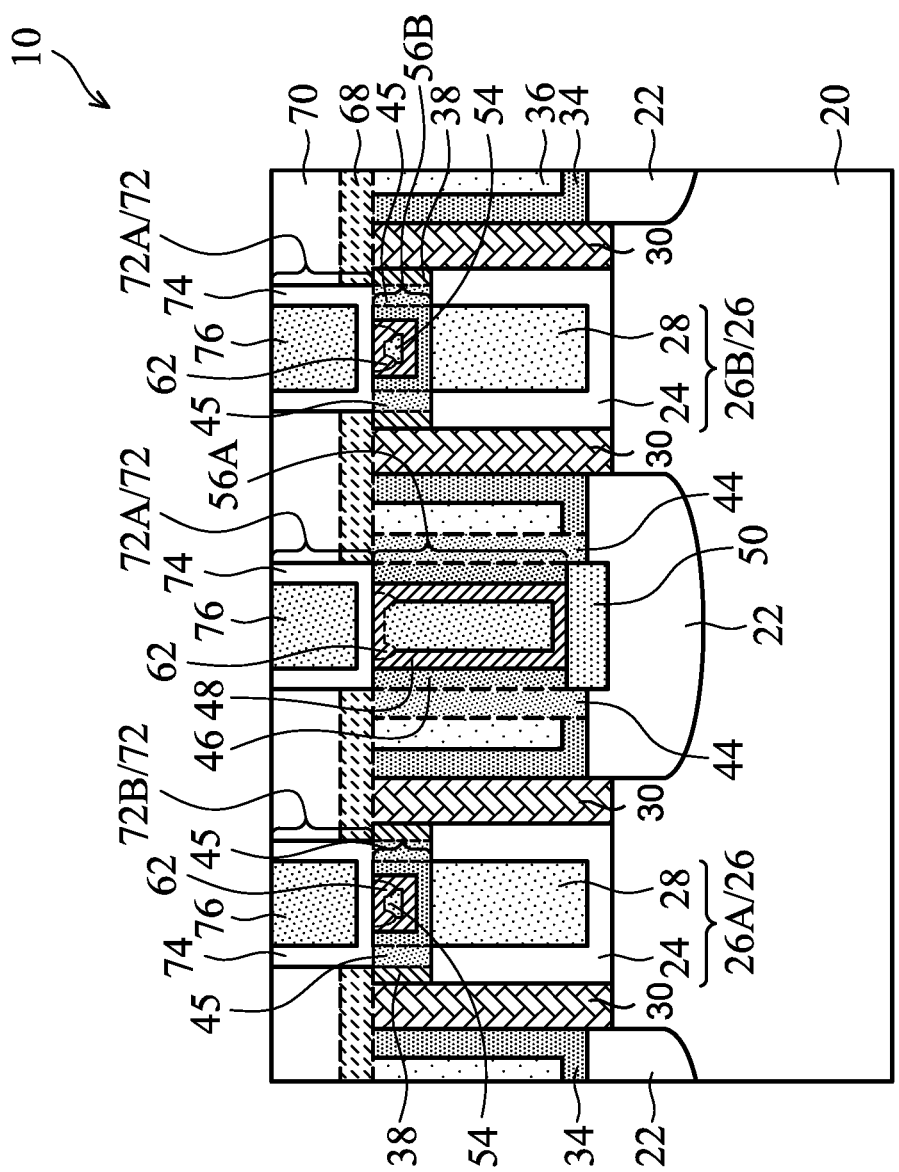
FIG. 13 illustrates a cross-sectional view of a transistor and contact plugs in accordance with some embodiments.

In the steps as shown in FIGS. 1 through 11A/11B, transistor 300 is formed. Referring to FIG. 12, etch stop layer 68 is formed, followed by the formation of dielectric layer 70. In accordance with some embodiments, dielectric layer 70 is an inter-layer dielectric, and hence is alternately referred to as ILD1 70. Etch stop layer 68 may also be omitted in accordance with some embodiments. Accordingly, etch stop layer 68 is illustrated using dashed lines to indicate it may or may not be formed. Etch stop layer 68 may be formed of silicon carbide, silicon oxynitride, silicon carbo-nitride, combinations thereof, or composite layers thereof. Etch stop layer 68 may be formed using a deposition method such as CVD, Plasma Enhanced Chemical Vapor Deposition (PECVD), ALD, or the like. ILD1 70 may include a material selected from PSG, BSG, BPSG, Fluorine-doped Silicon Glass (FSG), or TEOS oxide. ILD1 70 may also be formed of a non-porous low-k dielectric material, which may be a carbon-containing dielectric material. ILD1 70 may be formed using spin coating, FCVD, or the like, or may be formed using a deposition method such as CVD, PECVD, Low Pressure Chemical Vapor Deposition (LPCVD), or the like.

FIG. 12 further illustrates the formation of conductive features 72, which may be metal lines, metal vias, metal pads, etc. The formation of layers 68 and 70 and conductive features 72 is illustrated as step 216 in the process flow shown in FIG. 14. In accordance with some embodiments of the present disclosure, conductive feature 72 is a contact plug, and the etch stop layer 68 as shown in FIG. 10 is not formed. In accordance with alternative embodiments, conductive feature 72 is a copper via or a copper line, and etch stop layer 68 is formed in accordance with these embodiments.

The formation of conductive feature 72 may include forming an opening in dielectric layers 68 and 70 to expose contact plug 56, filling a conductive material(s) in the opening, and performing a planarization. Conductive features 72 may include conductive adhesion/barrier layers 74, and metallic material 76 over adhesion/barrier layers 74. Adhesion/barrier layer 74 may be formed of a material selected from titanium, titanium nitride, tantalum, tantalum nitride, combinations thereof, or multi-layers thereof. Metallic material 76 may be formed of tungsten, copper, aluminum, or alloys thereof, and may be formed using PVD, Metal-Organic Chemical Vapor Deposition (MOCVD) or plating. In accordance with some embodiments, metallic material 76 is formed using ECP, and the respective plating solution may have a sulfur content similar to plating solution 55 (FIG. 9), which has a sulfur content lower than about 100 ppm, or may be free from sulfur in order to reduce corrosion.

The embodiments of the present disclosure have some advantageous features. By lowering or removing sulfur in the plating solution for forming contact plugs, the corrosion of the contact plugs during CMP is reduced or eliminated. In addition, metal caps may be formed selectively to fill the recesses, if any, formed due to the corrosion. The gate contact plugs may also be formed fully between gate spacers to reduce the electrical short or leakage caused by the misalignment of the metal vias/plugs over the gate contact plugs.

In accordance with some embodiments of the present disclosure, a method includes forming an ILD to cover a gate stack of a transistor. The ILD and the gate stack are parts of a wafer. The ILD is etched to form a contact opening, and a source/drain region of the transistor or a gate electrode in the gate stack is exposed through the contact opening. A conductive capping layer is formed to extend into the contact opening. A metal-containing material is plated on the conductive capping layer in a plating solution using electrochemical plating. The metal-containing material has a portion filling the contact opening. The plating solution has a sulfur content lower than about 100 ppm. A planarization is performed on the wafer to remove excess portions of the metal-containing material. A remaining portion of the metal-containing material and a remaining portion of the conductive capping layer in combination form a contact plug.

In accordance with some embodiments of the present disclosure, a method includes forming an ILD, and etching the ILD to form a first contact opening and a second contact opening. A source/drain region and a gate electrode of a transistor are exposed through the first contact opening and the second contact opening, respectively. The method further includes depositing a metal layer extending into both the first contact opening and the second contact opening, and depositing a conductive capping layer. The conductive capping layer extends into both the first contact opening and the second contact opening. A metal-containing material is plated on the conductive capping layer in a plating solution using electrochemical plating. The plating solution is substantially free from sulfur. A planarization is performed on the wafer to remove excess portions of the metal-containing material. Remaining portions of the metal-containing material and remaining portions of the conductive capping layer form a source/drain contact plug and a gate contact plug.

In accordance with some embodiments of the present disclosure, a method includes forming an ILD, and etching the ILD to form a contact opening. A source/drain region or a gate electrode of a transistor is exposed through the contact opening. The method further includes depositing a metal layer extending into the contact opening, depositing a conductive capping layer having a first portion extending into the contact opening, and a second portion overlying the ILD, and plating a metal-containing material on the conductive capping layer in a plating solution using electrochemical plating. The plating solution is substantially free from sulfur. A planarization is performed on the wafer to remove excess portions of the metal-containing material. Remaining portions of the metal-containing material and a remaining portion of the conductive capping layer in combination form a contact plug. A top surface of the contact plug recesses from an adjacent top surface of the ILD to form a recess due to the planarization. A metal cap is selectively deposited in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a semiconductor region;
   a gate stack over the semiconductor region;
   a source/drain region extending into the semiconductor region;
   a source/drain silicide region over the source/drain region;
   a contact plug comprising:
      a titanium-based capping layer comprising:
         a bottom portion over and electrically connecting to one of the source/drain silicide region and the gate stack; and
         sidewall portions over, and connected to, the bottom portion; and
      a metal region between the sidewall portions of the titanium-based capping layer; and
      an additional capping layer comprising a first portion overlapping the metal region, and second portions extending into the sidewall portions of the titanium-based capping layer.

2. The integrated circuit structure of claim 1, wherein the second portions of the additional capping layer are on opposing sides of, and extend lower than, the first portion of the additional capping layer.

3. The integrated circuit structure of claim 1, wherein the additional capping layer comprises opposite edges contacting edges of the sidewall portions of the titanium-based capping layer.

4. The integrated circuit structure of claim 1, wherein the additional capping layer comprises a cobalt-based material.

5. The integrated circuit structure of claim 1, wherein the additional capping layer comprises a tungsten-based material.

6. The integrated circuit structure of claim 1, wherein the bottom portion of the contact plug contacts the source/drain silicide region.

7. The integrated circuit structure of claim 1, wherein the bottom portion of the contact plug contacts the gate stack.

8. The integrated circuit structure of claim 1, wherein the titanium-based capping layer comprises titanium nitride.

9. The integrated circuit structure of claim 1 further comprising a dielectric contact spacer encircling the contact plug.

10. An integrated circuit structure comprising:
    a semiconductor region;
    a gate stack over the semiconductor region, wherein the gate stack comprises a gate dielectric and a gate electrode over a bottom part of the gate dielectric;
    an Inter-layer Dielectric (ILD) having portions on opposite sides of the gate stack; and
    a contact plug in the ILD, the contact plug comprising:
       a metal layer comprising a first bottom portion, and first sidewall portions over and connected to the first bottom portion;
       a metal nitride layer comprising:
          a second bottom portion over and contacting the first bottom portion; and
          second sidewall portions over, and connected to, the second bottom portion;
       a first metal region over and contacting the second bottom portion of the metal nitride layer; and
       a capping layer overlapping the first metal region, wherein the capping layer is between the second sidewall portions of the metal nitride layer.

11. The integrated circuit structure of claim 10, wherein the contact plug is a gate contact plug, and the gate dielectric comprises sidewall parts over and connecting to opposing ends of the bottom part of the gate dielectric, and wherein the first bottom portion of the metal layer is over and contacting a top end of one of the sidewall parts of the gate dielectric.

12. The integrated circuit structure of claim 10, further comprising an additional contact plug over and contacting both of the capping layer and the second sidewall portions of the metal nitride layer.

13. The integrated circuit structure of claim 10, wherein the capping layer comprises:
    a first portion having a bottom surface contacting a top surface of the first metal region; and
    second portions on opposing sides of the first portion and extending lower than the first portion.

14. The integrated circuit structure of claim 13, wherein the second portions extend laterally into the second sidewall portions of the metal nitride layer.

15. The integrated circuit structure of claim 10 further comprising a dielectric contact spacer encircling the contact plug.

16. The integrated circuit structure of claim 15 further comprising:
- gate spacers on opposite sidewall of the gate stack; and
- a dielectric hard mask between the gate spacers and overlapping the gate stack, wherein the dielectric contact spacer and the contact plug penetrate through the dielectric hard mask to contact the gate stack.

17. An integrated circuit structure comprising:
- a contact plug comprising:
  - a metal region; and
  - a metal nitride layer comprising first sidewall portions on opposing sidewalls of the metal region;
- a metal layer comprising second sidewall portions on opposing sides of a combine region, wherein the combined region comprises the metal region and the metal nitride layer; and
- a capping layer overlapping the metal region and the first sidewall portions of the metal nitride layer, wherein a first top surface of the first sidewall portions of the metal nitride layer is at a same level as a second top surface of the capping layer.

18. The integrated circuit structure of claim 17 further comprising an additional layer over and contacting both of the capping layer and the first sidewall portions of the metal nitride layer, wherein the additional layer comprises a metal nitride.

19. The integrated circuit structure of claim 17, wherein the metal region forms a vertical interface with the metal nitride layer, and the capping layer overlaps the vertical interface.

20. The integrated circuit structure of claim 17, wherein the capping layer comprises a first portion, and second portions on opposing sides of the first portion, and the second portions extend lower than the first portion.

* * * * *